United States Patent
Lin et al.

(10) Patent No.: US 7,386,418 B2
(45) Date of Patent: Jun. 10, 2008

(54) YIELD ANALYSIS METHOD

(75) Inventors: Chen-Ting Lin, Hsinchu (TW); Chih-Hung Wu, Taipei (TW); Mei-Yen Li, Jhudong Township, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 781 days.

(21) Appl. No.: 11/010,595

(22) Filed: Dec. 13, 2004

(65) Prior Publication Data

US 2006/0128039 A1 Jun. 15, 2006

(51) Int. Cl.
*G06F 17/18* (2006.01)
(52) U.S. Cl. .................................... 702/179
(58) Field of Classification Search ................. 702/35, 702/57–59, 65, 82, 90, 118, 179, 182, 187, 702/184, 185, 193; 438/12, 14; 716/412
See application file for complete search history.

(56) References Cited

U.S. PATENT DOCUMENTS 6,799,130 B2 * 9/2004 Okabe et al. ................. 702/82
2003/0130806 A1 * 7/2003 Mizuno et al. ............... 702/35

* cited by examiner

*Primary Examiner*—Edward Raymond
*Assistant Examiner*—Mohamed Charioui
(74) *Attorney, Agent, or Firm*—Thomas, Kayden, Horstemeyer & Risley

(57) ABSTRACT

A yield analysis method. First, a wafer having multiple dies is inspected to obtain wafer defect data containing defect information for every die in the wafer. Then a wafer map and an overall yield are generated according to the wafer defect data. The wafer map displays defective dies and defect-free dies in the wafer. Then, first and second systematic limited yields are calculated in accordance with the wafer defect data and the wafer map, wherein the first systematic limited yield is calculated excluding defective dies with localized distribution, and the second systematic limited yield is calculated excluding defective dies with repeated distribution. Then a random defect limited yield is determined in accordance with the overall yield, the first systematic limited yield, and the second systematic limited yield.

19 Claims, 7 Drawing Sheets

YIELD ANALYSIS METHOD

BACKGROUND OF THE INVENTION

1. Field of the Invention

The present invention relates to yield analysis, and in particular, to a yield analysis method capable of distinguishing random defect yield losses and systematic failure causing yield losses.

2. Description of the Related Art

With multi-billion dollar semiconductor fabrication facilities experiencing increased time-to-market pressures, accurate yield analysis and rapid yield improvement are essential to achieve profitable production of integrated circuits. For maximum competitiveness, cost per die must be minimized while quickly elevating the manufacturing yield to an economically acceptable level.

As shown in FIG. 1, defect inspection data of a wafer is depicted as a wafer map. A wafer 10 has a plurality of arrays of IC devices or chips, wherein each dark color marker 11 represents a failed chip and each blank color marker 13 represents a good chip.

These yield losses may be the result of random defects or systematic failures.

Random defects are defined as any physical anomaly that causes a circuit to fail and include shorts or resistive paths or openings caused by particles, excess metal that bridges steep underlying contours causing shorts, photoresist splatters and flakes, weak spots in insulators, pinholes, openings due to step coverage problems, scratches, and others.

Systematic failures have an observable, non-random signature, possibly over time or spatial signature. Some systematic failures caused by mis-processing escape inline optical inspections in the fabrication process as well as during parametric testing. A prevalent example is the edge loss illustrated in FIG. 2A. The thickness of films deposited on the wafer is often well-controlled across the central portion of the wafer but poorly near the edge, resulting in wholesale die yield loss near the edge. As shown in FIG. 2B, the spatial distribution of defective dies has a repeated pattern when a defective reticle is used for photolithography. Parametric testing and inline inspection are typically performed on a sample basis and exclude edge dies. Hence, systematic failures such as edge losses and random defects are factors in die yield loss.

Quality control in integrated circuit (IC) fabrication has traditionally been based on overall summary data such as lot or wafer yield. These measures are adequate if the defective ICs are distributed randomly both within and across wafers in a lot. In practice, however, the defects often occur in clusters or display other systematic patterns. In general, these spatially clustered defects have assignable causes that can be traced to individual machines or to a series of process steps not meeting specified requirements.

The overall yield is conventionally decomposed into systematic limited yield and defect limited yield. The overall yield is the product of the systematic limited yield and the defect limited yield. However, there is no effective way to individually calculate systematic limited yield and defect limited yield from known overall yield data.

Hence, there is a need for routine monitoring of probe test data at the wafer map level to distinguish systematic failure-based yield losses from those caused by random defects.

SUMMARY OF THE INVENTION

Accordingly, an object of the invention is to provide a yield analysis method. The yield analysis method is capable of calculating respective systematic limited yield and random defect limited yield from a known overall yield data and of decomposing the systematic limited yield into localized-failure-excluded and repeated-failure-excluded yield data.

In one embodiment, the yield analysis method uses the spatial distribution of defects. First, a wafer having multiple dies is inspected to obtain wafer defect data containing defect information for every die in the wafer. Then a wafer map and an overall yield are generated according to the wafer defect data. The wafer map identifies defective dies and defect-free dies in the wafer. Next, a first systematic limited yield and second systematic limited yield are calculated in accordance with the wafer defect data and the wafer map. The first systematic limited yield is calculated excluding defective dies with localized distribution. The second systematic limited yield is calculated excluding defective dies with repeated distribution. Then a random defect limited yield is determined in accordance with the overall yield, the first systematic limited yield, and the second systematic limited yield.

Another embodiment of the invention is to provide a yield analysis system to implement the yield analysis method described above. The yield analysis system comprises a data collector, a wafer map generator, an overall yield calculator, a first calculator, a second calculator, and a third calculator.

The data collector coupled to a wafer inspection instrument is capable of collecting wafer defect data from the wafer inspection instrument.

The wafer map generator coupled to the data collector is capable of generating a wafer map in accordance with the wafer defect data.

The overall yield calculator coupled to the data collector is capable of calculating an overall yield in accordance with the wafer defect data.

The first and second calculators coupled to the data collector and the overall yield calculator are capable of calculating first and second systematic limited yields respectively, wherein calculation is based on the wafer defect data and the wafer map. The first systematic limited yield is calculated excluding defective dies with localized distribution; the second systematic limited yield is calculated excluding defective dies with repeated distribution.

The third calculator, coupled to the overall yield calculator, the first calculator, and the second calculator, is capable of calculating the random defect limited yield in accordance with the overall yield, the first systematic limited yield, and the second systematic limited yield.

In yet another embodiment, the above-mentioned method may take the form of program code embodied in tangible media. When the program code is loaded into and executed by a machine, the machine becomes an apparatus for practicing the invention.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

With reference to the accompanying drawings, embodiments of the present invention are described. In these embodiments, the yield analysis method or system is implemented in wafer fabrication, wherein each processed wafer comprises 460 dies.

Figure 1:
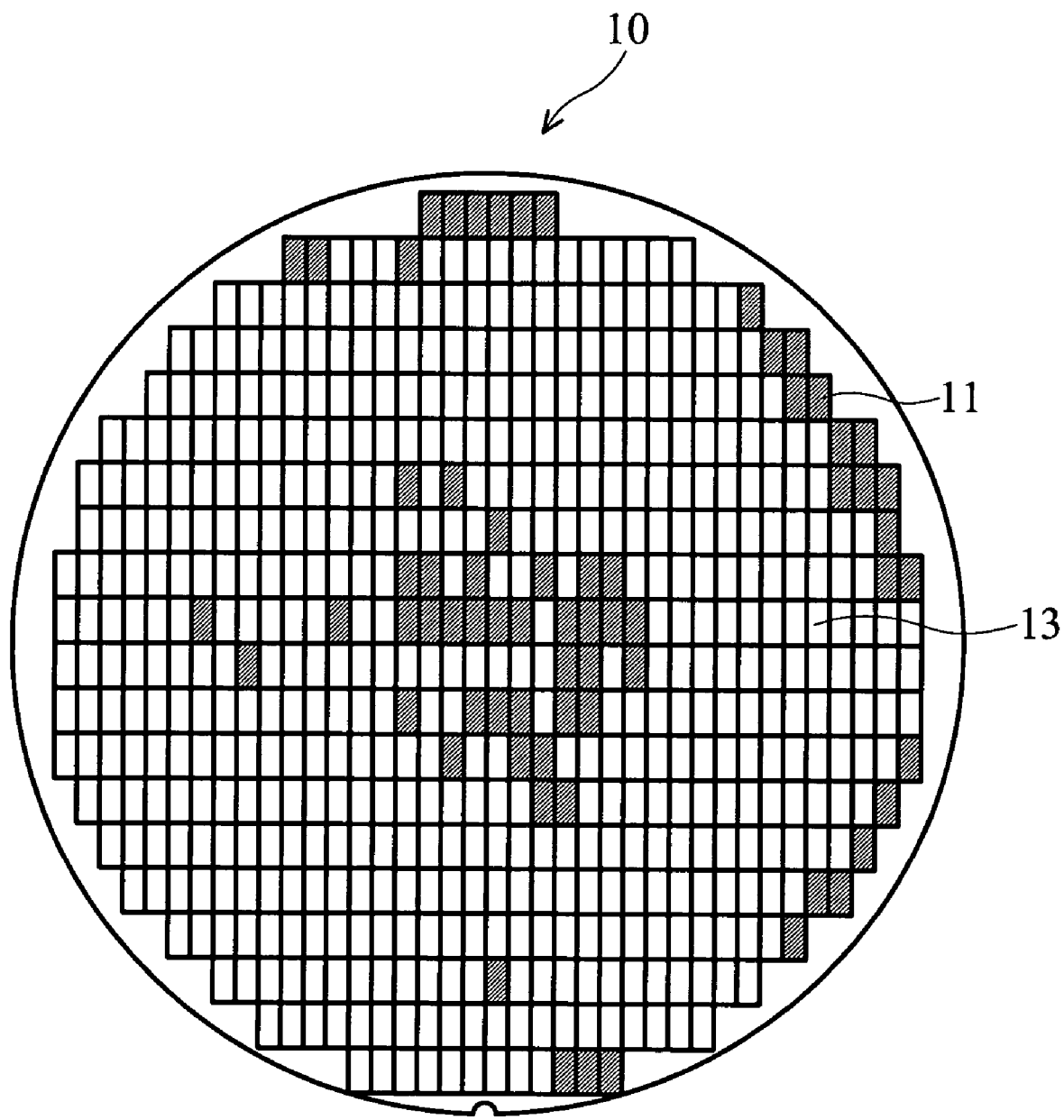
FIG. 1 is a schematic view of a wafer map as referenced in the Prior Art.
Figure 2A:
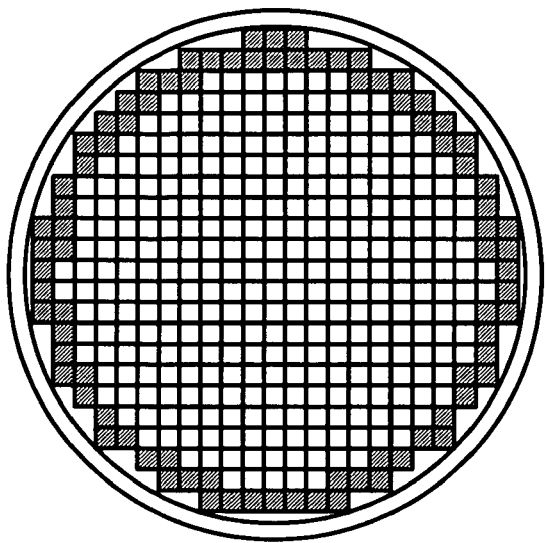
FIGS. 2A and 2B illustrate spatial distribution patterns of defective dies as referenced in the Prior Art.
Figure 2B:
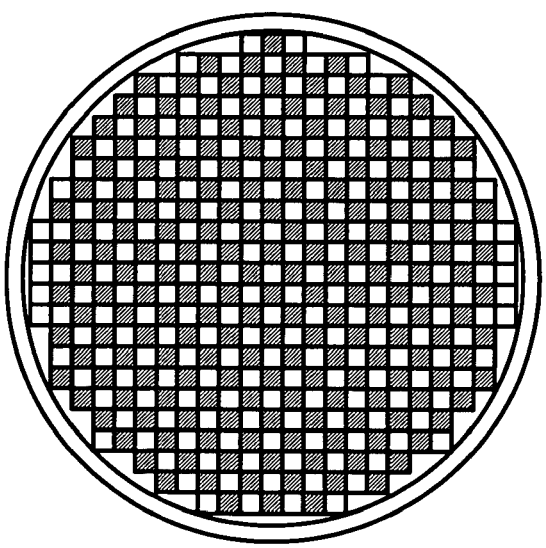
Figure 3:
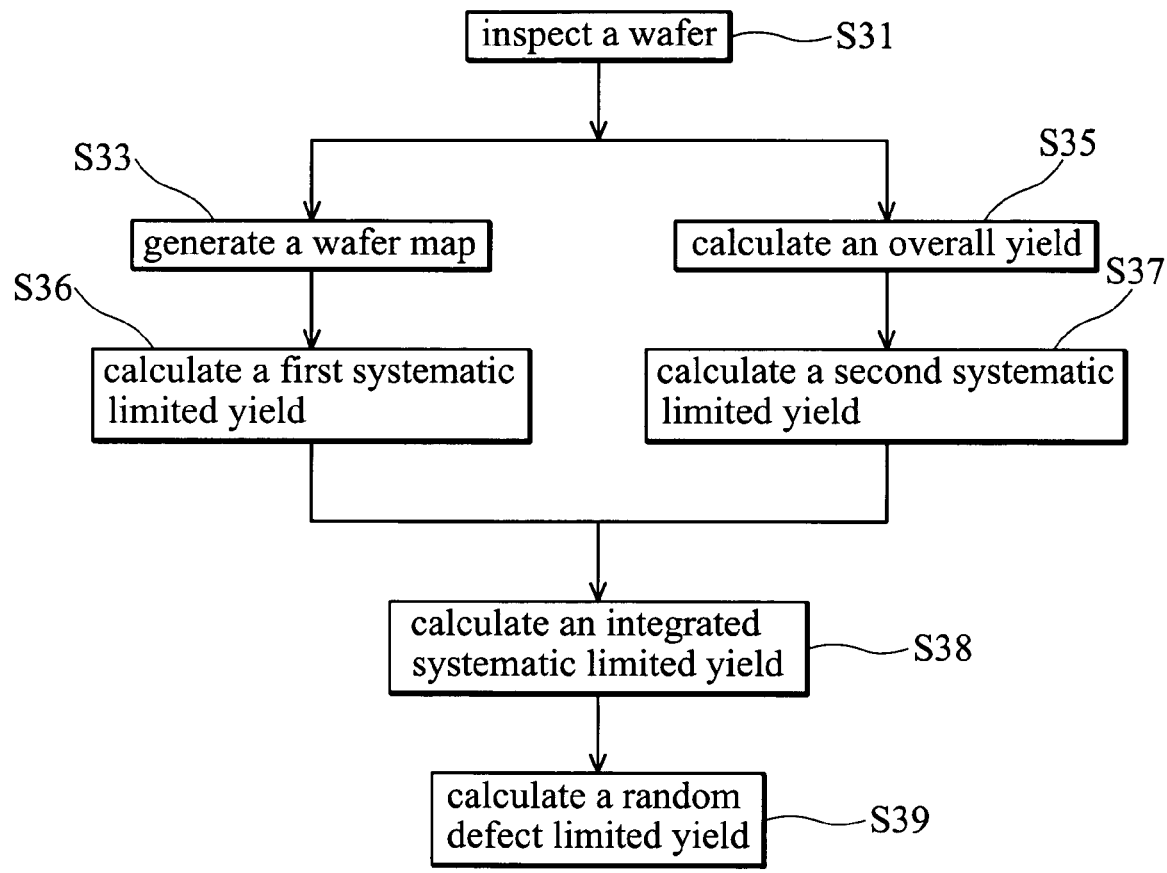
FIG. 3 is a flowchart of an embodiment of the yield analysis method according to the present invention.

FIG. 3 is a flowchart showing the yield analysis method of the invention. In step S31, a wafer having 460 dies is inspected to obtain wafer defect data containing defect information for every die in the wafer. The wafer defect data is generated by various test and measurement devices such as focused ion beam, electronic microscope, inspector, defect-scanning machine, in-situ particle inspector, and other inspection devices. The wafer defect data shows that among the 460 dies in the wafer, 112 dies are defective and the other 348 dies are not.

Then a wafer map is generated in step S33 and an overall yield is calculated in step S35 according to the wafer defect data. The overall yield is 75.65%, calculated by dividing the number of defect-free dies in the wafer by the total die number in the wafer (348/460). The wafer map displays defective dies and defect-free dies in the wafer.

Then, first and second systematic limited yields are calculated in accordance with the wafer defect data and the wafer map in steps S36 and S37.

Figure 4:
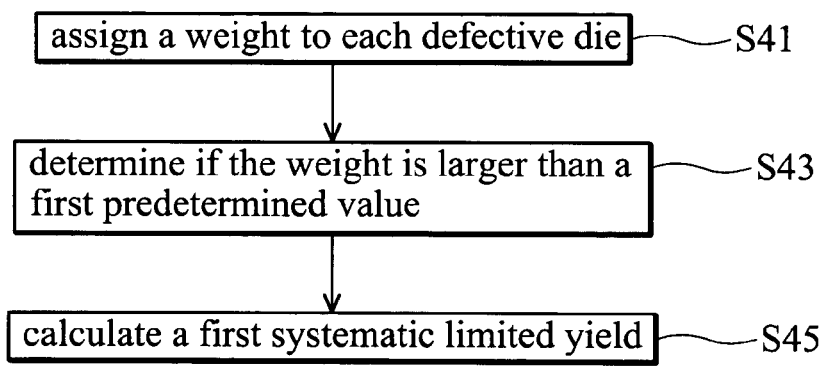
FIG. 4 is a flowchart of the process of calculating the first systematic limited yield of FIG. 3.

The first systematic limited yield is calculated excluding defective dies with localized distribution, as described in FIGS. 4 and 5. During the calculation of the first systematic limited yield, 70 defective dies are classified as having localized distribution, thus the first systematic limited yield is 89.23%, calculated by dividing the number of defect-free dies in the wafer by the localized-defect-die-excluded die number in the wafer (348/(460−70)).

Figure 6A:
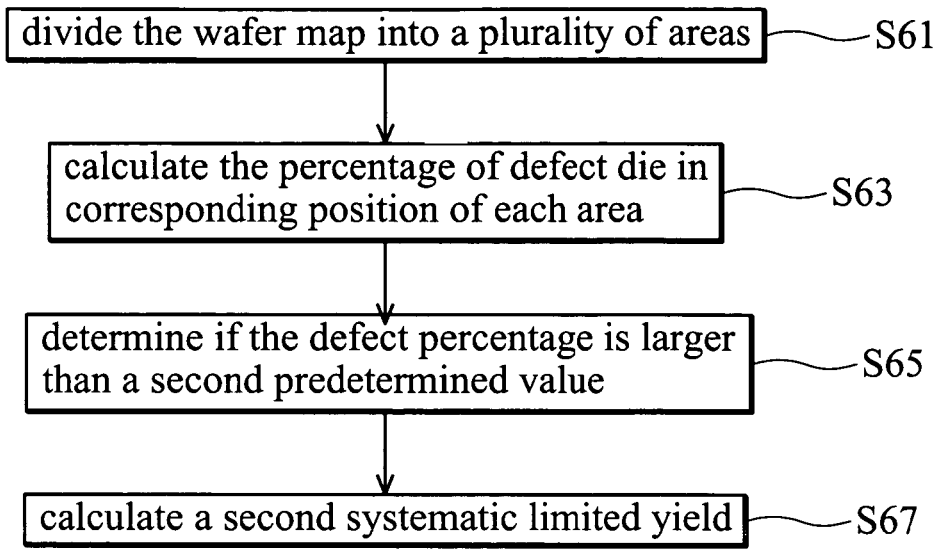
FIG. 6A is a flowchart of the process of calculating the second systematic limited yield of FIG. 3.
Figure 6B:
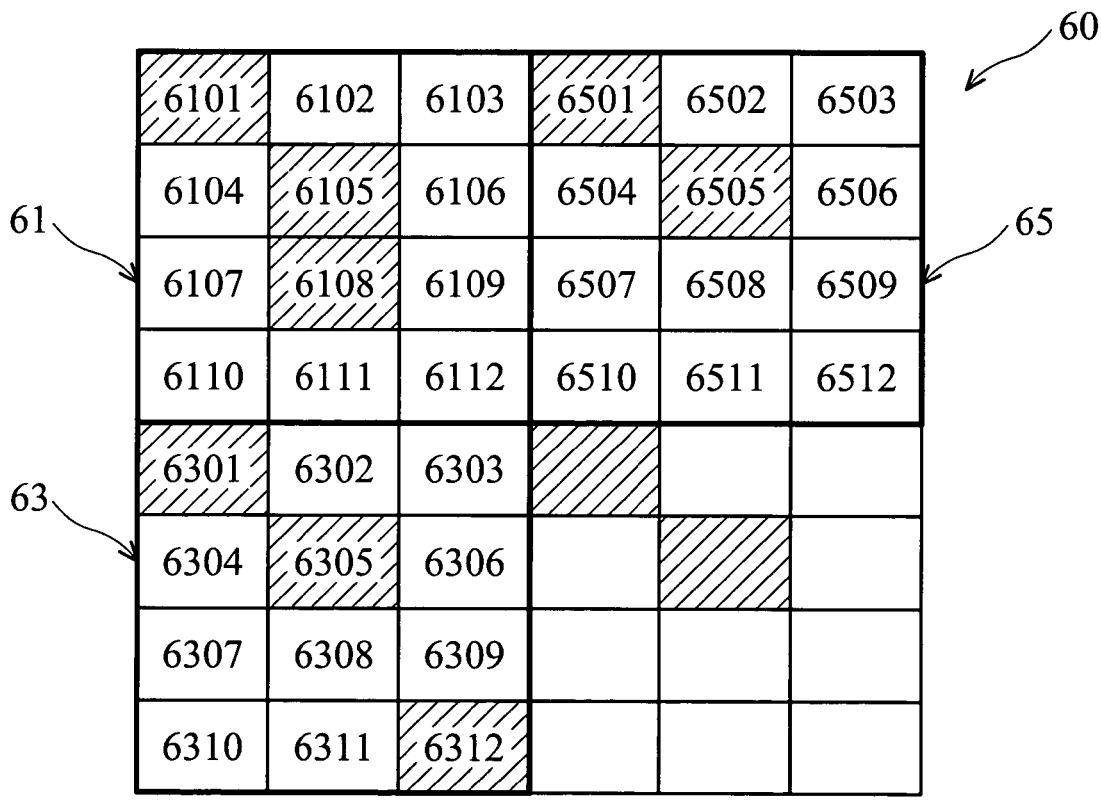
FIG. 6B illustrates a spatial distribution of defective dies as referenced in FIG. 6A.

The second systematic limited yield is calculated excluding defective dies with repeated distribution, as described with FIGS. 6A and 6B. During the calculation of the second systematic limited yield, 91 defective dies are classified as having repeated distribution, thus the second systematic limited yield is 94.31%, calculated by dividing the number of defect-free dies in the wafer by the repeated-defect-die-excluded die number in the wafer (348/(460−91)).

In step S38 the product of the first and second systematic limited yields is calculated and provides an integrated systematic limited yield of 84.15%.

Next a random defect limited yield is determined in accordance with the overall yield, the first systematic limited yield, and the second systematic limited yield (step S39). The random defect limited yield is 89.90%, calculated by dividing the overall yield by the integrated systematic limited yield (75.65%/84.15%).

FIG. 4 is a flowchart showing the process of calculating the first systematic limited yield of the invention. First, each defective die in the wafer is assigned a weight in step S41. All defective dies in contiguity constitute a defective die cluster. The weight of a particular defective die is determined according to the number of defective dies in the corresponding cluster. The process of determining the weight is detailed below in the discussion accompanying FIG. 5.

In step S43, it is determined if the weight of a particular defective die exceeds a first predetermined value, and if so, the corresponding defective die is classified as having localized distribution, referred to as a localized defective die, otherwise the corresponding defective die is classified as having non-localized distribution, referred to as a non-localized defective die. According to this embodiment, the predetermined value is 20. A defective die with a weight larger than 20 is located in a defective die cluster having more than 20 defective dies. The comparison reveals that, among the 460 dies in the wafer, 70 defective dies have a weight greater than 20 and are thus classified as localized defective dies. These 70 localized defective dies are subtracted from the total 460 dies of the wafer. Then the first systematic limited yield is calculated based on the subtracted die number in step S45. The first systematic limited yield is 89.23%.

The defective die referred to as a localized defective die is located in contiguity to other defective dies to form a cluster. The cluster index indicates the degree of clustering of a particular defective die. According to this embodiment, the cluster index equals the number of defective dies in a particular defective die cluster.

The predetermined value, which serves as the criterion to distinguish localized defective dies from non-localized defective dies, is a matter of choice. Generally, the predetermined value is larger when dealing with a wafer having more dies. For example, in this embodiment, there are 460 dies on a wafer, and the predetermined value is 20. If there are 350 dies on another wafer of the same size, then the predetermined value 20 may be improper and lowered.

Figure 5A:
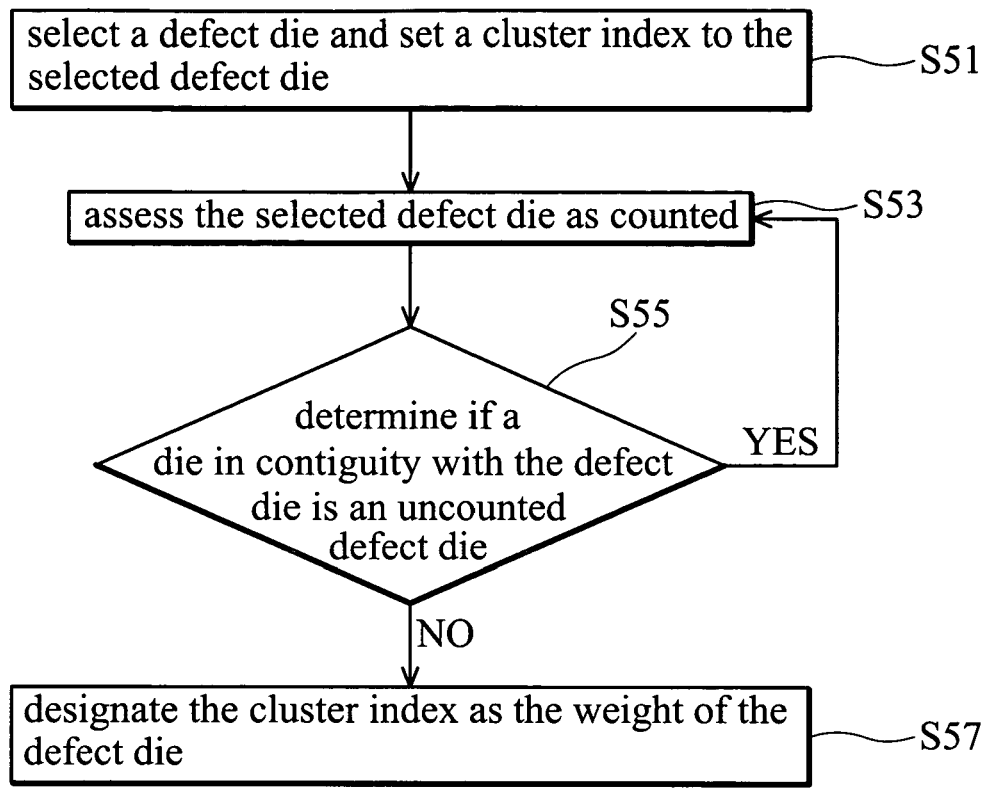
FIG. 5A is a flowchart of the process of determining the weight of each defective die of FIG. 4.
Figure 5B:
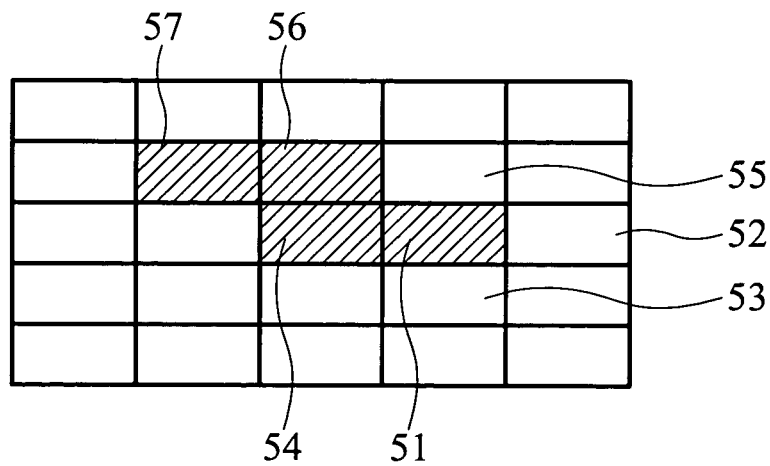
FIG. 5B illustrates a spatial distribution of defective dies as referenced in FIG. 5A.

Using FIGS. 5A and 5B as examples, FIG. 5A is a flowchart showing the process of determining the weight of each defective die of the invention, and FIG. 5B illustrates spatial distribution of defective dies as referenced in FIG. 5A. First, a defective die 51 (FIG. 5B) is selected from the defective dies of the wafer, and a cluster index of the defective die 51 is set to 1 in step S51. The cluster index indicates the number of detected defective dies contiguous to the selected die.

Then the defective die 51 is classified as detected in step S53. The "detected" denotation is designed to prevent a particular defective die from being repeatedly detected.

In step S55, it is determined whether a die in contiguity with the defective die 51 is an undetected defective die, and if so, the cluster index is increased by 1, the undetected defective die is classified as being selected, and the process returns to the previous step (step S53), otherwise the process proceeds to the next step (step S57). The defective die 51 has four contiguous dies, namely, dies 52 to 55. Each contiguous die has a shared line of contact with the defective die 51. Among them, dies 52, 53, and 55 are defect-free dies, whereas die 54 is a defective die. The cluster index is increased by 1 to indicate the number of detected defective dies forming a cluster with the die 51 is 2, including dies 51 and 54.

Then die 54 is classified as a selected die, and the process returns to the previous step (step S53). In step S53, the defective die 51 is classified as being detected. In step S55, it is determined whether a die in contiguity with the defective die 54 is an undetected defective die, and if so, the cluster index is increased by 1, the undetected defective die is classified as being selected, and the process returns to step S53, otherwise the process proceeds to step S57. Die 54 has four contiguous dies. Note that die 51 has been detected, so there are 3 undetected dies contiguous to die 54. Among the 3 undetected dies contiguous to die 54, only die 56 is a defective die. And among the 3 undetected dies contiguous to die 56, only die 57 is a defective die. All of the undetected dies contiguous to die 57 are defect-free dies. The number of detected defective dies forming a cluster with the selected die is 4, including dies 51, 54, 56, and 57. Thus the cluster index of die 51 is set to 4. The cluster index is the same for all constituents in the cluster, i.e., dies 54, 56, and 57 also have a cluster index 4.

In step S57, the cluster index of a particular defective die is designated as the weight of the defective die.

The above-mentioned process is repeated until all defective dies are classified as being detected.

FIG. 6A is a flowchart showing the process of calculating the second systematic limited yield of the invention, and FIG. 6B illustrates spatial distribution of defective dies as referenced in FIG. 6A.

First, wafer map 60 is divided into a plurality of areas (step S61). These areas are shown in FIG. 6B in bold lines, such as areas 61, 63, and 65. Each area comprises 12 dies printed with one photolithography reticle shot. For example, area 61 comprises dies 6101 to 6112; area 62 comprises dies 6201 to 6212; area 63 comprises dies 6301 to 6312.

Then a percentage of the defective dies in each corresponding position of each area is calculated in step S63. For example, percentage of defective dies among dies 6101, 6301, and 6501 is calculated.

In step S65, it is determined if the defect percentage exceeds a second predetermined value, and if so, the corresponding defective dies are classified as repeatedly distributed, otherwise the corresponding defective dies are classified as non-repeatedly distributed.

According to this embodiment, the second predetermined value is 0.3 (30%). The second predetermined value depends on the fabrication processes and the types of product. There were 91 defective dies classified as non-repeatedly distributed.

In step S67, the second systematic limited yield is calculated, from which the repeatedly distributed defective dies are excluded.

Figure 7:
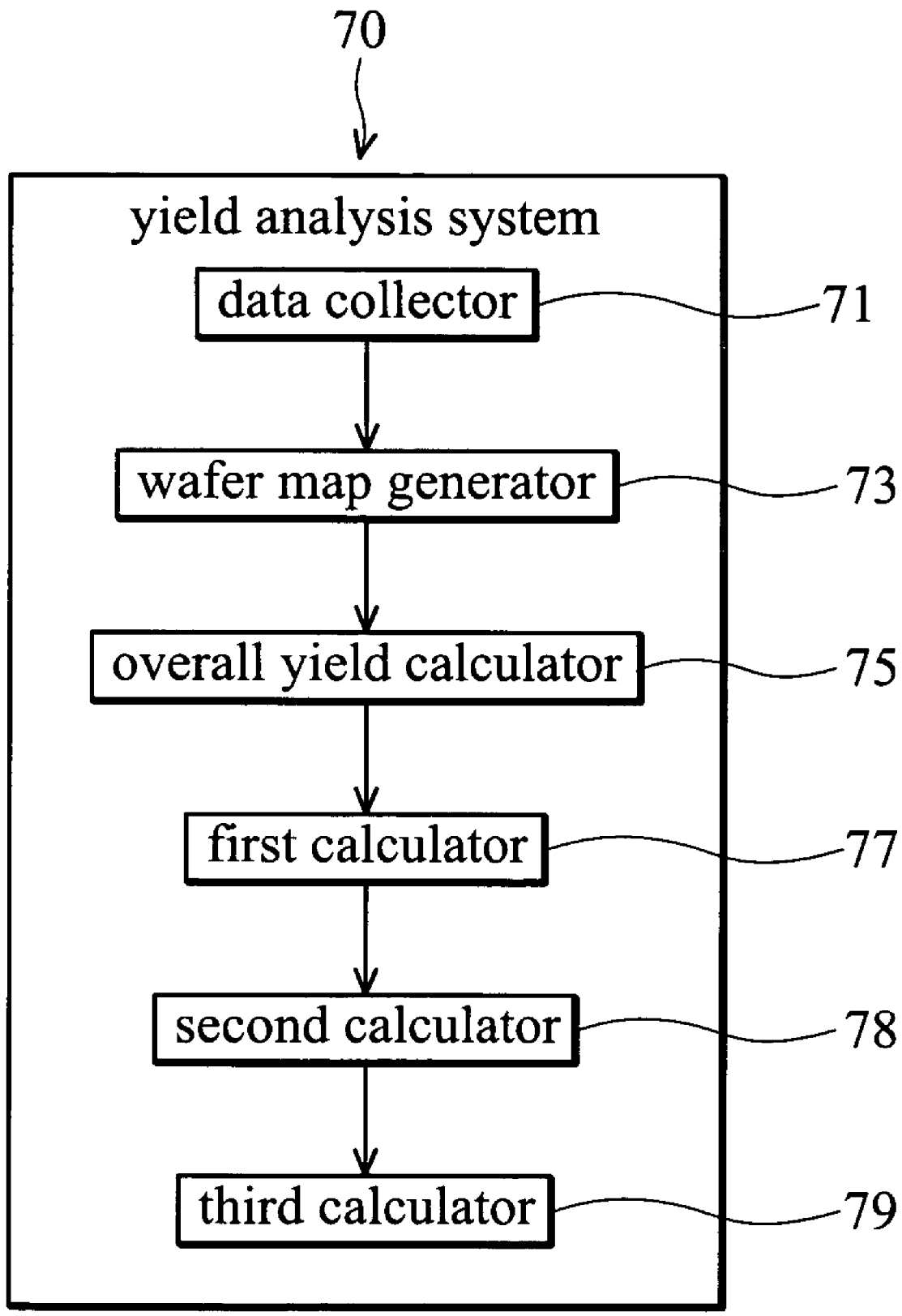
FIG. 7 is a schematic view of an embodiment of a yield analysis system according to the present invention.

FIG. 7 is a schematic view showing an embodiment of a yield analysis system of the present invention. A yield analysis system 70 comprises a data collector 71, a wafer map generator 73, an overall yield calculator 75, a first calculator 77, a second calculator 78, and a third calculator 79.

The data collector 71, coupled to a wafer inspection instrument, collects wafer defect data from the wafer inspection instrument.

The wafer map generator 73, coupled to the data collector, generates a wafer map in accordance with the wafer defect data.

The overall yield calculator 75, coupled to the data collector, calculates an overall yield in accordance with the wafer defect data.

The first calculator 77, coupled to the data collector and the overall yield calculator, calculates a first systematic limited yield in accordance with the wafer defect data and the wafer map, wherein the first systematic limited yield is calculated excluding defective dies with localized distribution.

The second calculator 78, coupled to the data collector and the overall yield calculator, calculates a second systematic limited yield in accordance with the wafer defect data and the wafer map, wherein the second systematic limited yield is calculated excluding defective dies with repeated distribution.

The third calculator 79, coupled to the overall yield calculator, the first calculator, and the second calculator, calculates a random defect limited yield in accordance with the overall yield, the first systematic limited yield, and the second systematic limited yield.

The methods and system of the present invention, or certain aspects or portions thereof, may take the form of program code (i.e., instructions) embodied in tangible media, such as floppy diskettes, CD-ROMS, hard drives, or any other machine-readable storage medium, wherein, when the program code is loaded into and executed by a machine, such as a computer, the machine becomes an apparatus for practicing the invention. The methods and apparatus of the present invention may also be embodied in the form of program code transmitted over some transmission medium, such as electrical wiring or cabling, through fiber optics, or via any other form of transmission, wherein, when the program code is received and loaded into and executed by a machine, such as a computer, the machine becomes an apparatus for practicing the invention. When implemented on a general-purpose processor, the program code combines with the processor to provide a unique apparatus that operates analogously to specific logic circuits.

Figure 8:
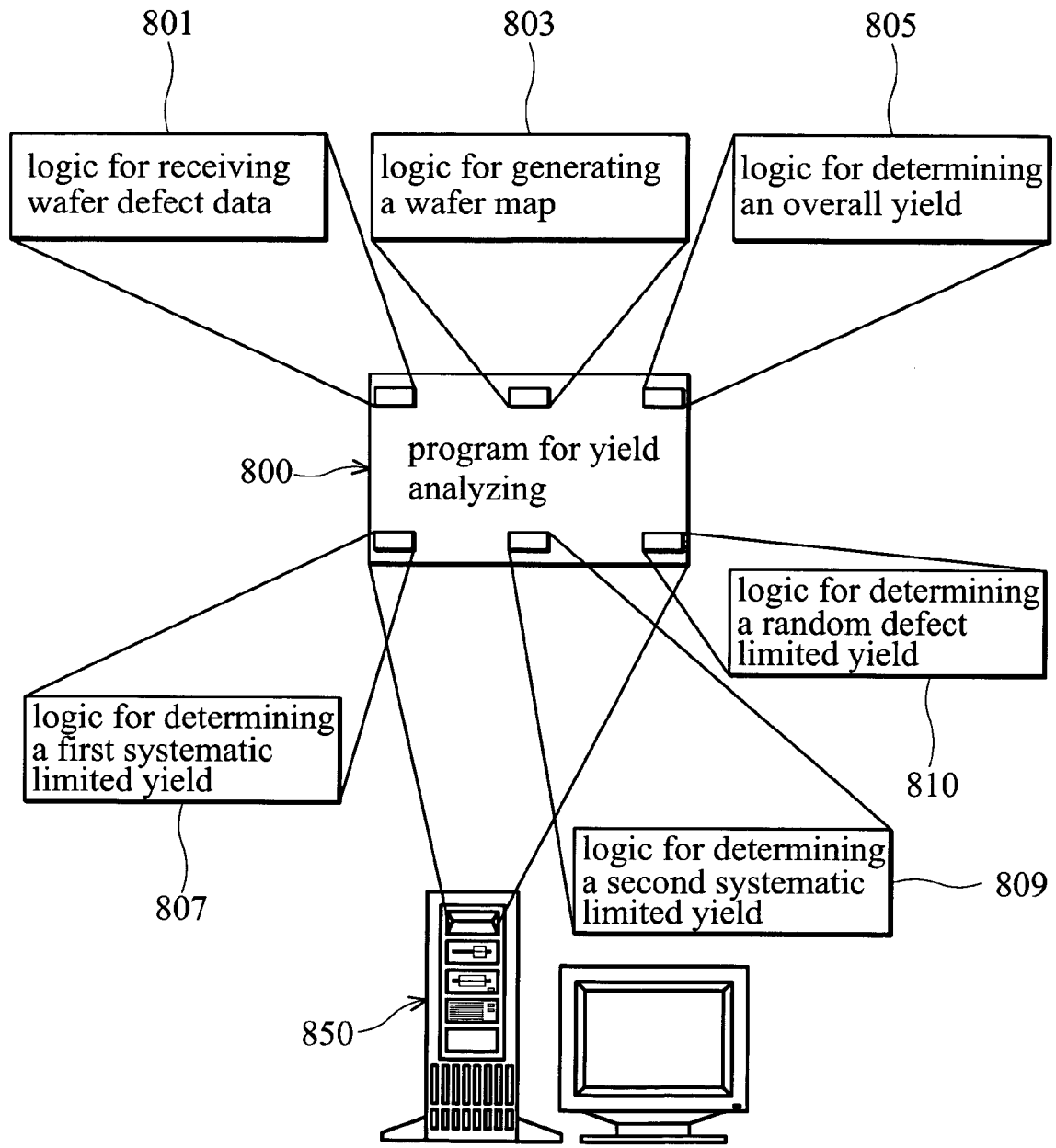
FIG. 8 is a diagram of a storage medium for storing a computer program providing the yield analysis method according to the present invention.

FIG. 8 is a diagram of an embodiment of a storage medium for storing a computer program providing the yield analysis method according to the present invention. The computer program system comprises a computer usable storage medium having computer readable program code 800 embodied in the medium, comprising computer readable program code 801 for receiving wafer defect data, a computer readable program code 803 for generating a wafer map displaying defective dies and defect-free dies in the wafer, a computer readable program code 805 for determining an overall yield, a computer readable program code 807 for determining a first systematic limited yield, a computer readable program code 809 for determining a second systematic limited yield, and a computer readable program code 810 means for determining a random defect limited yield.

While the invention has been described by way of example and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A wafer fabricating method, comprising:
    inspecting a first wafer to obtain wafer defect data containing defect information for every die in the first wafer;
    generating a wafer map displaying defective dies and defect-free dies in the first wafer in accordance with the wafer defect data;
    determining an overall yield in accordance with the wafer defect data;
    determining a first systematic limited yield in accordance with the wafer defect data and the wafer map, wherein the first systematic limited yield is calculated excluding defective dies with localized distribution;
    determining a second systematic limited yield in accordance with the wafer defect data and the wafer map, wherein the second systematic limited yield is calculated excluding defective dies with repeated distribution;
    determining a random defect limited yield in accordance with the overall yield, the first systematic limited yield, and the second systematic limited yield;
    generating processing tool setting information in accordance with the overall yield, the first systematic limited yield, the second systematic limited yield, and the random defect limited yield;
    setting a plurality of processing tools in accordance with the processing tool setting information; and
    processing a second wafer with the processing tools.

2. The wafer fabricating method as claimed in claim 1, wherein the overall yield of the first wafer is the percentage of defect-free dies within all dies in the first wafer.

3. The wafer fabricating method as claimed in claim 1, wherein determination of the first systematic limited yield further comprises:
    determining a weight for each defective die in the wafer in accordance with the number of contiguous defective dies adjoining each defective die;
    determining if the weight exceeds a predetermined value, and if so, classifying the corresponding defective die as a localized defective die, otherwise classifying the corresponding defective die as a non-localized defective die;
    calculating the first systematic limited yield, from which the localized defective dies are excluded.

4. The wafer fabricating method as claimed in claim 1, wherein determination of the weight further comprises:
    (1) selecting a first defective die from the defective dies of the wafer, and setting a cluster index of the first defective die to 1;
    (2) classifying the selected defective die as being detected;
    (3) determining whether a die in contiguity with the selected defective die is an undetected defective die, and if so, increasing the cluster index by 1, classifying the undetected defective die as being selected, and returning to step (2), otherwise proceeding to the next step;
    (4) adopting the cluster index as the weight of those selected dies.

5. The wafer fabricating method as claimed in claim 1, wherein determination of the second systematic limited yield further comprises:
    dividing the wafer map into a plurality of areas, wherein each area comprises a plurality of dies printed with one photolithography reticle shot;
    calculating a defect percentage of the dies in each corresponding position of each area; and
    determining whether the percentage exceeds a predetermined value, and if so, classifying the corresponding defective dies as repeatedly distributed, otherwise classifying the corresponding defective dies as non-repeatedly distributed.

6. The wafer fabricating method as claimed in claim 1, wherein the random defect limited yield is the quotient obtained by dividing the overall yield with a ratio of the first systematic limited yield to the second systematic limited yield.

7. The wafer fabricating method as claimed in claim 1, wherein a wafer is produced using the processing tools.

8. A yield analysis method, comprising:
    providing a wafer having multiple dies;
    inspecting the wafer to obtain wafer defect data containing defect information for every die in the wafer;
    generating a wafer map displaying defective dies and defect-free dies in the wafer in accordance with the wafer defect data;
    determining an overall yield in accordance with the wafer defect data;
    determining a first systematic limited yield in accordance with the wafer defect data and the wafer map, wherein the first systematic limited yield is calculated excluding defective dies with localized distribution;
    determining a second systematic limited yield in accordance with the wafer defect data and the wafer map, wherein the second systematic limited yield is calculated excluding defective dies with repeated distribution; and
    determining a random defect limited yield in accordance with the overall yield, the first systematic limited yield, and the second systematic limited yield.

9. The yield analysis method as claimed in claim 8, wherein determination of the first systematic limited yield further comprises:
    determining a weight of each defective die in the wafer in accordance with the number of defective dies in contiguity with a particular defective die;
    determining if the weight exceeds a first predetermined value, and if so, classifying the corresponding defective die as a localized defective die, otherwise classifying the corresponding defective die as a non-localized defective die; and
    calculating the first systematic limited yield, from which the localized defective dies are excluded.

10. The yield analysis method as claimed in claim 9, wherein determination of the weight further comprises:
    (1) selecting a first defective die from the defective dies of the wafer, and setting a cluster index of the first defective die to 1;
    (2) classifying the selected defective die as being detected;
    (3) determining whether a die in contiguity with the selected defective die is an undetected defective die, and if so, increasing the cluster index by 1, classifying the undetected defective die as being selected, and returning to step (2), otherwise proceeding to the next step;
    (4) adopting the cluster index as the weight of the selected dies.

11. The yield analysis method as claimed in claim 8, wherein determination of the second systematic limited yield further comprises:

dividing the wafer map into a plurality of areas, wherein each area comprises a plurality of dies printed with one photolithography reticle shot;

calculating a defect percentage of the dies in each corresponding position of each area;

determining whether the percentage exceeds a second predetermined value, and if so, classifying the corresponding defective dies as repeatedly distributed, otherwise classifying the corresponding defective dies as non-repeatedly distributed; and calculating the second systematic limited yield, wherein the repeatedly distributed defective dies are excluded.

12. A yield analysis system, comprising:

a data collector coupled to a wafer inspection instrument for collecting wafer defect data from the wafer inspection instrument;

a wafer map generator coupled to the data collector for generating a wafer map in accordance with the wafer defect data;

an overall yield calculator coupled to the data collector for calculating an overall yield in accordance with the wafer defect data;

a first calculator coupled to the data collector and the overall yield calculator for calculating a first systematic limited yield in accordance with the wafer defect data and the wafer map, wherein the first systematic limited yield is calculated excluding defective dies with localized distribution;

a second calculator coupled to the data collector and the overall yield calculator for calculating a second systematic limited yield in accordance with the wafer defect data and the wafer map, wherein the second systematic limited yield is calculated excluding defective dies with repeated distribution; and a third calculator coupled to the overall yield calculator, the first calculator, and the second calculator for calculating a random defect limited yield in accordance with the overall yield, the first systematic limited yield, and the second systematic limited yield.

13. The yield analysis system as claimed in claim 12, wherein the first calculator is capable of determining a weight for each defective die in the wafer in accordance with the number of contiguous defective dies adjoining each defective die, determining if the weight exceeds a predetermined value, and if so, classifying the corresponding defective die as a localized defective die, otherwise classifying the corresponding defective die as a non-localized defective die, and calculating the first systematic limited yield, from which the localized defective dies are excluded.

14. The yield analysis system as claimed in claim 13, wherein the first calculator is capable of selecting at least one defective die from the defective dies of the wafer, determining the cluster index of the selected dies in accordance with the number of defective dies in contiguity, and adopting the cluster index as the weight of the selected dies.

15. The yield analysis system as claimed in claim 12, wherein the second calculator is capable of dividing the wafer map into a plurality of areas, wherein each area comprises a plurality of dies printed with one photolithography reticle shot, calculating a defect percentage of the dies in each corresponding position of each area, and determining whether the percentage exceeds a predetermined value, and if so, classifying the corresponding defective dies as repeatedly distributed, otherwise classifying the corresponding defective dies as non-repeatedly distributed.

16. A storage medium for storing a computer program providing a method of yield analysis, the method comprising:

receiving wafer defect data containing defect information for every die in the wafer;

generating a wafer map displaying defective dies and defect-free dies in the wafer in accordance with the wafer defect data;

determining an overall yield in accordance with the wafer defect data;

determining a first systematic limited yield in accordance with the wafer defect data and the wafer map, wherein the first systematic limited yield is calculated excluding defective dies with localized distribution;

determining a second systematic limited yield in accordance with the wafer defect data and the wafer map, wherein the second systematic limited yield is calculated excluding defective dies with repeated distribution; and determining a random defect limited yield in accordance with the overall yield, the first systematic limited yield, and the second systematic limited yield.

17. The storage medium as claimed in claim 16, wherein determination of the first systematic limited yield further comprises:

determining a weight for each defective die in the wafer in accordance with the number of contiguous defective dies adjoining each defective die;

determining if the weight exceeds a predetermined value, and if so, classifying the corresponding defective die as a localized defective die, otherwise classifying the corresponding defective die as a non-localized defective die;

calculating the first systematic limited yield, from which the localized defective dies are excluded.

18. The storage medium as claimed in claim 17, wherein determination of the weight further comprises:

(1) selecting a first defective die from the defective dies of the wafer, and setting a cluster index of the first defective die to 1;

(2) classifying the selected defective die as being detected;

(3) determining whether a die in contiguity with the selected defective die is an undetected defective die, and if so, increasing the cluster index by 1, classifying the undetected defective die as being selected, and process returning to step (2), otherwise proceeding to the next step;

(4) adopting the cluster index as the weight of those selected dies.

19. The storage medium as claimed in claim 16, wherein determination of the second systematic limited yield further comprises:

dividing the wafer map into a plurality of areas, wherein each area comprises a plurality of dies printed with one photolithography reticle shot;

calculating a defect percentage of the dies in each corresponding position of each area; and determining whether the percentage exceeds a predetermined value, and if so, classifying the corresponding defective dies as repeatedly distributed, otherwise classifying the corresponding defective dies as non-repeatedly distributed.

* * * * *